(12) United States Patent
Sandhu et al.

(10) Patent No.: US 6,713,234 B2
(45) Date of Patent: *Mar. 30, 2004

(54) FABRICATION OF SEMICONDUCTOR DEVICES USING ANTI-REFLECTIVE COATINGS

(75) Inventors: Gurtej S. Sandhu, Boise, ID (US); Zhiping Yin, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/252,448

(22) Filed: Feb. 18, 1999

(65) Prior Publication Data

US 2001/0038973 A1 Nov. 8, 2001

(51) Int. Cl.[7] .............................. G03F 7/00; G03F 7/36; H01L 21/00
(52) U.S. Cl. .................. 430/313; 430/290; 430/314; 430/317; 430/950; 438/72; 438/952
(58) Field of Search ................. 430/313, 314, 430/317, 950, 290; 438/72, 952

(56) References Cited

U.S. PATENT DOCUMENTS

| | | | | |
|---|---|---|---|---|
| 4,722,913 A | * | 2/1988 | Miller | 437/196 |
| 5,488,246 A | | 1/1996 | Hayashide et al. | 257/336 |
| 5,534,462 A | * | 7/1996 | Fiordalice et al. | 437/190 |
| 5,710,067 A | * | 1/1998 | Foote | 437/238 |
| 5,733,712 A | * | 3/1998 | Tanaka | 430/314 |
| 5,741,626 A | * | 4/1998 | Jain | 430/314 |
| 5,910,021 A | * | 6/1999 | Tabara | 438/636 |
| 5,932,487 A | * | 8/1999 | Lou | 438/692 |
| 5,981,398 A | * | 11/1999 | Tsai et al. | 438/710 |
| 6,051,369 A | * | 4/2000 | Azuma et al. | 430/312 |
| 6,103,456 A | * | 8/2000 | Tobben | 430/317 |
| 6,156,485 A | * | 12/2000 | Tang et al. | 430/313 |
| 6,187,687 B1 | * | 2/2001 | Plat et al. | 438/724 |
| 6,210,856 B1 | * | 4/2001 | Lin et al. | 430/270.1 |
| 6,268,295 B1 | * | 7/2001 | Ohta et al. | 438/735 |

* cited by examiner

Primary Examiner—Mark F. Huff
Assistant Examiner—Nicole Barreca
(74) Attorney, Agent, or Firm—Dickstein Shapiro Morin & Oshinsky LLP

(57) ABSTRACT

Techniques are disclosed for fabricating a device using a photolithographic process. The method includes providing a first anti-reflective coating over a surface of a substrate. A layer which is transparent to a wavelength of light used during the photolithographic process is provided over the first anti-reflective coating, and a photosensitive material is provided above the transparent layer. The photosensitive material is exposed to a source of radiation including the wavelength of light. Preferably, the first anti-reflective coating extends beneath substantially the entire transparent layer. The complex refractive index of the first anti-reflective coating can be selected to maximize the absorption at the first anti-reflective coating to reduce notching of the photosensitive material.

15 Claims, 4 Drawing Sheets

FABRICATION OF SEMICONDUCTOR DEVICES USING ANTI-REFLECTIVE COATINGS

BACKGROUND

The present invention relates generally to the manufacture of semiconductor devices and, in particular, to methods for fabricating such devices using anti-reflective layers, as well as devices including anti-reflective coatings.

The fabrication of integrated circuits requires the precise positioning of a number of regions in a semi-conductor wafer, followed by one or more interconnection patterns. The regions include a variety of implants and diffusions, cuts for gates and metallizations, and windows in protective cover layers through which connections can be made to bonding pads. A sequence of steps is required for each such region.

Photolithographic techniques, for example, can be used in the performance of some or all of the foregoing operations. Typically, for example, the surface of a wafer to be processed is pre-coated with a photoresist. The photoresist then is exposed to a light source with a suitably patterned mask positioned over the wafer. The exposed resist pattern is used, for example, to open windows in a protective underlying layer to define semiconductor regions or to delineate an interconnection pattern.

To improve the degree of integration and to obtain high density devices, performing photolithographic operations at shorter wavelengths is desirable. Currently, i-line techniques with a wavelength of about 365 nanometers (nm), KrF excimer laser techniques with a wavelength of about 248 nm, and KnF excimer laser techniques with a wavelength of about 193 nm are used. However, at those wavelengths, optical reflections at the interfaces of previously-formed layers on the semiconductor wafer can cause notching of the photoresist.

FIG. 1 illustrates the general nature of the problem. A semiconductor wafer 10 includes one or more previously-formed layers 12 covered by a thick layer of boro-phospho-silicate glass (BPSG) 14. The BPSG layer 14 serves as a protective layer for the underlying layers 12 and also provides a more planar surface. A photoresist film 16 is coated over the BPSG layer 14, and a mask 18 is positioned over the photoresist prior to exposure of the photoresist to an appropriate source of radiation 20. The mask 18 can be used to define, for example, contact holes for one of the previously-formed layers 12.

Ideally, when the photoresist film 16 is exposed to the radiation 20, the mask 18 precisely defines the dimensions of the exposed regions of the photoresist film. However, the BPSG layer 14 is transparent to the wavelengths typically used in photolithography, including 248 nm and 365 nm. Thus, a significant amount of the radiation 20 that passes through the mask 18 travels through the BPSG layer 14 and is reflected at the interface between the BPSG layer and one or more of the previously-formed underlying layers 12. Some of the reflected radiation (indicated by arrow 22) contributes to exposure of the photoresist film 16.

In some situations, a dielectric anti-reflective coating is provided above the BPSG layer to reduce reflections from the underlying layers. However, if the structures in the previously-formed underlying layers 12 have varying dimensions or varying shapes and the level of reflected light is relatively high, the reflected light 22 will expose the photoresist film 16 non-uniformly leading to the formation of notching.

SUMMARY

In general, techniques are disclosed for fabricating a device using a photolithographic process. The techniques are particularly advantageous for transferring an optical pattern by photolithography to one or more layers which are transparent to the wavelength(s) at which the photolithography is performed.

According to one aspect, a method includes providing a first anti-reflective coating over a surface of a substrate. As used herein, the term "substrate" refers to one or more semiconductor layers or structures which may include active or operable portions of semiconductor devices. Various films or other materials may be present on the semiconductor layers or structures. A layer which is transparent to a wavelength of light used during the photolithographic process is provided over the first anti-reflective coating, and a photosensitive material is provided above the transparent layer. The photosensitive material is exposed to a source of radiation including the wavelength of light. Preferably, the first anti-reflective coating extends beneath substantially the entire transparent layer.

According to another aspect, a semiconductor device includes a layer that is transparent to light having a wavelength, for example, of approximately 193 nm, 248 nm or 365 nm. A first anti-reflective coating extends substantially entirely beneath the transparent layer.

One advantage of providing an anti-reflective coating beneath the transparent layer is that the anti-reflective coating can help reduce notching of the photosensitive material that may occur during the photolithographic process.

In general, the complex refractive index of the first anti-reflective coating can be selected to maximize (or increase) the absorption at the first anti-reflective coating to minimize (or reduce) the amount of light transmitted through the first anti-reflective coating and reflected back from the underlying structures. Therefore, the effects of the non-uniform structures in the layers below the first anti-reflective coating can be reduced or eliminated. That, in turn reduces the amount of light that is reflected back toward the photosensitive material and, therefore, further reduces notching.

Various implementations include one or more of the following features. The transparent layer can include a material such as BPSG, PSG and TEOS. Other materials, including various oxides and nitrides, also can be used as the transparent layer. Depending on the properties of the photosensitive material, it can be exposed to radiation at various wavelengths including approximately 193 nm, 248 nm or 365 nm. Portions of the photosensitive material selectively can be exposed to the radiation.

The first anti-reflective coating can include various materials, including a material comprising silicon and nitrogen; silicon and oxygen; or silicon, oxygen and nitrogen. Other materials, such as organic polymers, also can be used as the first anti-reflective coating.

According to another aspect, in addition to the first anti-reflective coating, a second anti-reflective coating can be provided above the transparent layer. The photosensitive material then can be provided over the second anti-reflective coating. Providing the second anti-reflective coating between the photosensitive material and the transparent layer can further help reduce the effects of light that is reflected from the interface of the first anti-reflective coating and the transparent layer.

Other features and advantages will be readily apparent from the following description, the accompanying drawings, and the claims.

DETAILED DESCRIPTION

As explained in greater detail below, a technique is described for transferring an optical pattern by photolithography to one or more layers which are transparent to the wavelength(s) at which the photolithography is performed. The technique is described with respect to the formation of a contact hole through a BPSG layer. However, the technique is generally applicable to the formation of various features in integrated devices involving the transfer of a pattern by photolithography to other transparent layers as well. Such layers include, for example, phospo silicate glass (PSG), tetra-ethyl-ortho-silicate (TEOS), undoped oxides, among others.

Figure 1:
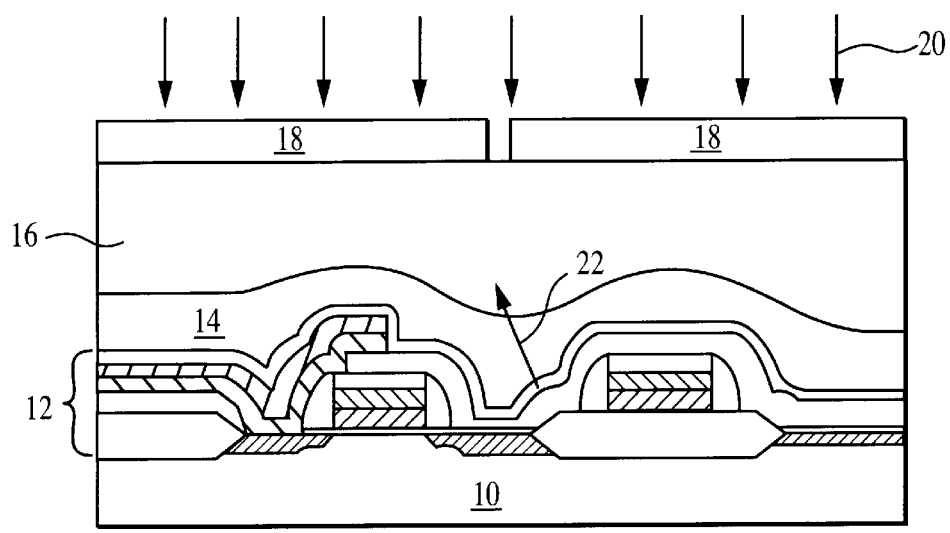
FIG. 1 is a partial cross-section of a semiconductor wafer during performance of a photolithographic process.
Figure 2:
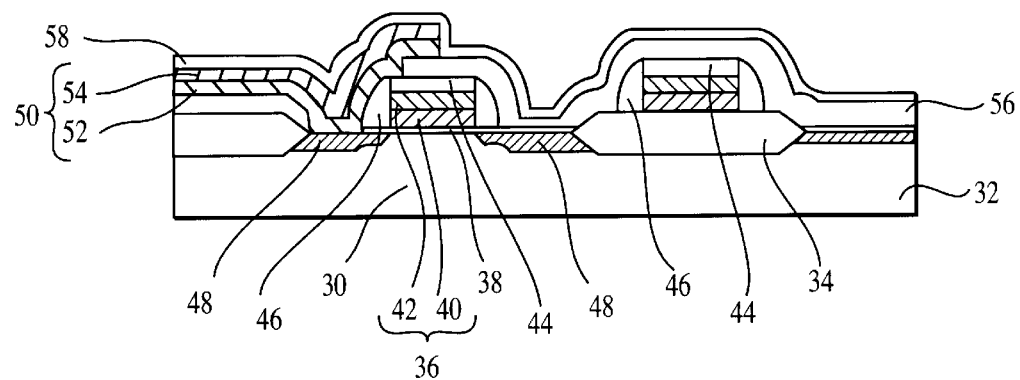
FIG. 2 illustrates a cross-section of an exemplary, partially-fabricated semiconductor device.

As shown in FIG. 2, an exemplary partially-fabricated semiconductor device includes an active region 30 formed on a semiconductor wafer 32 and surrounded by an isolation oxide film 34. A gate electrode 36 is formed in the active region 30 with a gate oxide film 38 disposed between the electrode and the active region. The gate electrode 36 includes a first polycrystalline silicon (poly-Si) film 40 and a first refractory metal silicide film 42. The gate electrode 36 has its top portion covered with a silicon oxide film 44 and its sidewalls covered with an insulation film 46.

Impurity diffusion layers 48 form source and drain regions at the upper surface of the wafer 32 at either side of the gate electrode to provide a metal-oxide-semiconductor (MOS) field effect transistor structure. A silicon oxide layer 56 is provided over the surface of the substrate.

A first interconnection layer 50, including a second poly-Si layer 52 and a second refractory metal silicide layer 54, is formed on one of the impurity diffusion layers 48. As shown in FIG. 2, a silicon oxide film 58 is formed over the entire upper surface of the substrate.

Techniques for forming the foregoing layers are well-known and, therefore, are not described in further detail.

Figure 3:
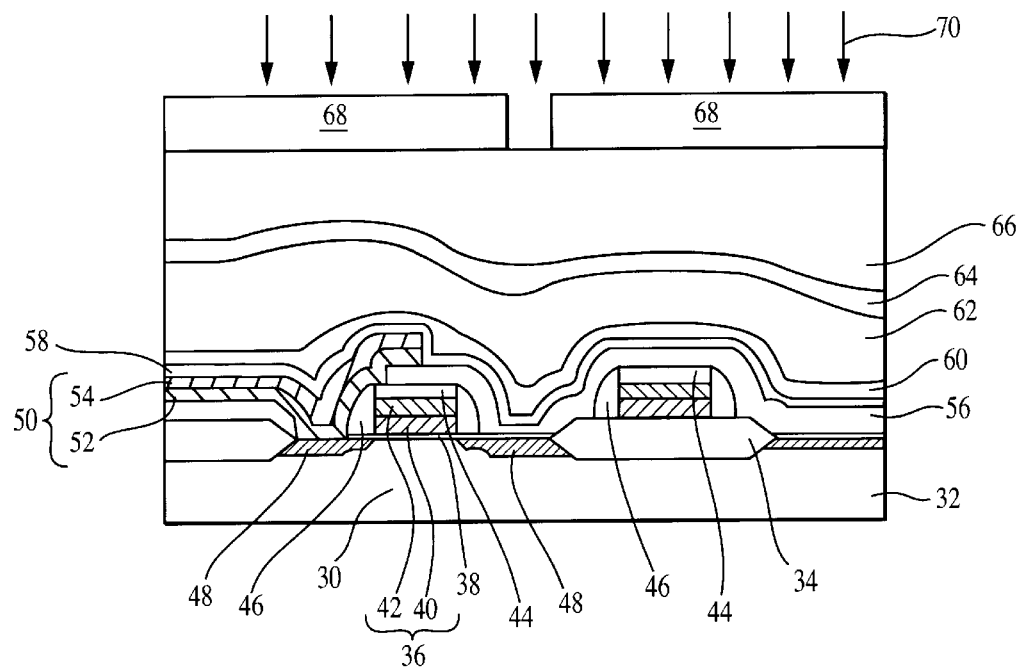
FIG. 3 illustrates a cross-section of the device of FIG. 2 during performance of a photolithographic process according to the invention.

Prior to forming a protective BPSG layer, a first dielectric anti-reflective coating (ARC) 60 is formed over substantially the entire upper surface of the substrate (FIG. 3). In one implementation, the first dielectric ARC 60 has a thickness in the range of approximately 200–500 angstroms (Å), although in general, the thickness will vary depending on the particular application and can be greater than 500 Å or less than 200 Å.

Next, a BPSG layer 62 is deposited on the first dielectric ARC 60, for example, by vapor deposition. The BPSG layer 62 can be heated at a temperature of approximately 850 celsius (° C.) to form an interlayer insulation film having a relatively flat surface. The thickness of the BPSG layer 62 is typically much greater than the thickness of the first dielectric ARC 60 and may be as great as 20,000 Å. Preferably, the first ARC 60 extends substantially beneath the entire BPSG layer 62.

A second dielectric ARC 64 is formed over substantially the entire upper surface of the BPSG layer 62. The second dielectric ARC 64 also can include, for example, a silicon oxide ($Si_xO_y$:H) film, a silicon nitride film ($Si_xN_y$:H) or a silicon oxy-nitride ($Si_xO_yN_z$:H) film. Other materials also can used for the second dielectric ARC 64. In one implementation, the second dielectric ARC 64 has a thickness in the range of approximately several hundred angstroms (Å), although in general, the thickness will vary depending on the particular application and can be greater or less.

A photosensitive film, such as a photoresist 66, is deposited over the second dielectric ARC 64, and a mask 68 is positioned over the photoresist prior to exposure of the photoresist to an appropriate source of radiation 70. Depending on the properties of the photoresist, the radiation which exposes the photoresist can include one or more different wavelengths. Exemplary sources of radiation include those used in i-line techniques with a wavelength of about 365 nanometers (nm), KrF excimer laser techniques with a wavelength of about 248 nm, and ArF excimer laser techniques with a wavelength of about 193 nm. In the illustrated example of FIG. 3, the mask 68 is used to define contact holes for one of the previously-formed layers.

One advantage of providing the dielectric ARC 60 immediately below the BPSG layer 62 is that the ARC 60 can reduce the amount of notching that may result during the photolithographic process for defining the contact holes. In general, the complex refractive index of the first ARC 60 can be selected to maximize the absorption at the first anti-reflective coating to minimize amount of transmitted light through the first anti-reflective coating back from the underlying structures. Therefore, the effects of the non-uniform structures in the layers below the first ARC can be reduced or eliminated. That, in turn reduces the amount of light that can be reflected back toward the photo-sensitive material and, therefore, further reduces notching.

The complex refractive index of a material includes a real part n, known as the refractive index and defining the velocity of light in the material, and an imaginary part k which corresponds to the material's light absorption coefficient. In the discussion that follows, the real and imaginary parts (n, k) of the complex refractive index for the various layers will be referred to as follows:

| Layer | n | k |
| --- | --- | --- |
| Underlayer | $n_1$ | $k_1$ |
| First ARC (60) | $n_2$ | $k_2$ |
| BPSG (62) | $n_3$ | $k_3$ |
| Second ARC (64) | $n_4$ | $k_4$ |

The reflectance and transmittance at the interface of the BPSG layer 62 and the first dielectric ARC 60 are determined by $n_2$, $k_2$, $n_3$ and $k_3$. To increase the absorption in the first dielectric ARC 60, $k_2$ should be relatively high, for example, at least as high as 1.0 and preferably as high as 1.5.

The first dielectric ARC 60 can include, for example, a silicon oxide ($Si_xO_y$:H) film, a silicon nitride ($Si_xN_z$:H) film or a silicon oxy-nitride ($Si_xO_yN_z$:H) film. Other materials, including titanium nitride and organic compounds such as polymers, also can used for the first dielectric ARC 60. In one implementation, a ($Si_xO_yN_z$:H) layer can be formed as the ARC 60 using a plasma-enhanced vapor deposition technique. A film including a mixture of silicon (Si), oxygen (O), nitrogen (N) and hydrogen (H) atoms can be formed by exciting a plasma in a gas mixture of silane and nitrogen oxide ($N_2O$) diluted by helium (He). For example, to obtain a $Si_xO_yN_z$:H layer with a value of n equal to about 2.13 and a value of k equal to about 1.23 for light having a wavelength of 248 nm, the flow rates of silane, $N_2O$ and He can be approximately 80 sccm, 80 sccm and 2200 sccm, respectively. The $Si_xO_yN_z$:H layer is formed at a temperature of about 400° C. and a pressure of about 5.6 Torr. The RF power can be set to approximately 105 watts.

If the topography of the underlying structure below the first ARC 60 is not substantially planar, then light reflected from the interface of the first ARC and the BPSG layer 62 will tend to scatter in various directions non-uniformly. Providing the second ARC 64 between the photoresist layer 66 and the BPSG layer 62 can help reduce the effects that any such non-uniform light has on the photoresist.

The second ARC 64 also can include, for example, a $Si_xO_y$:H film, a $Si_xN_z$:H film or a $Si_xO_yN_z$:H film. Other materials, including titanium nitride and organic compounds such as polymers, also can be used for the second dielectric ARC 64. In general, the values of $n_4$ and $k_4$ for the second ARC 64 should be selected to minimize or reduce the reflectivity at the interface between the photoresist layer 66 and the second ARC 64. Selecting a suitable material for the second ARC 64 can be determined using known simulated techniques. Generally, however, selection of the material for the second ARC 64 will depend on the BPSG layer 62 as well as on the first ARC 60. The layers below the first ARC 60 can be ignored due to the high absorption of the first ARC 60.

Figure 4:
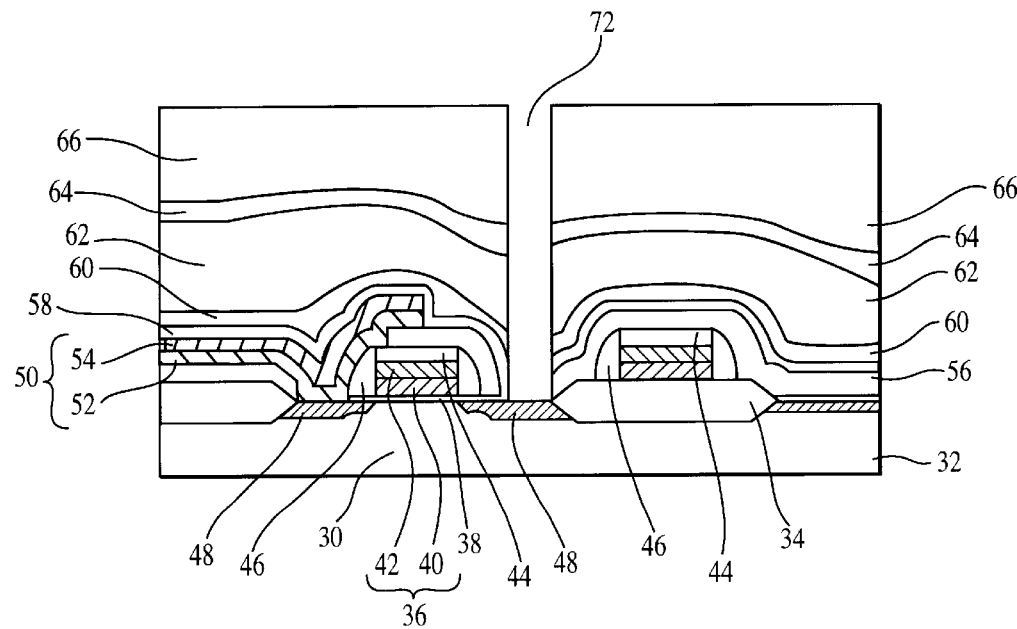
FIG. 4 illustrates a cross-section of the device of FIG. 3 following formation of a contact hole.

Once the photolithographic process is performed and the photoresist 66 is developed, the ARC 64, the BPSG layer 62, the ARC 60, the silicon oxide layers 56, 58 and the gate oxide film 38 are etched successively to form a contact hole 72 (FIG. 4). The remaining resist 66 then can be removed, and fabrication of the device, including the formation of metallization contacts, can be completed using conventional techniques. Upon completion of the device, the first anti-reflective coating 60 will extend beneath substantially the entire transparent layer 62.

Figure 5:
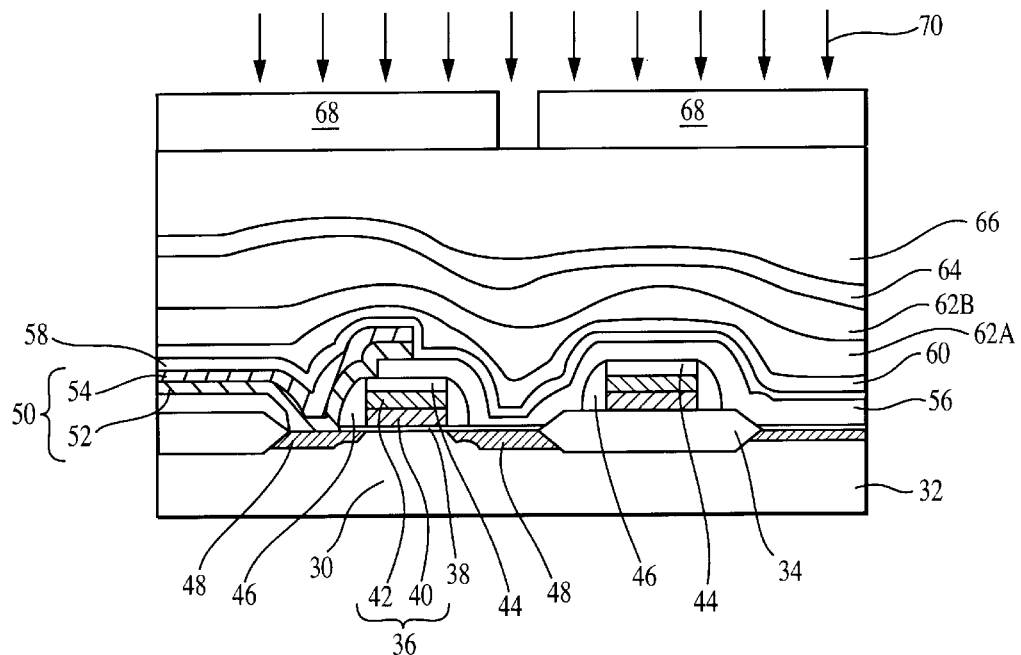
FIG. 5 illustrates a cross-section of a device having multiple layers to which a photolithographic pattern is to be transferred and which are transparent to the light used during the photolithographic process.

In some cases, the layer which is transparent to the wavelength(s) of light may include multiple vertically stacked layers 62A, 62B (FIG. 5) rather than a single layer, where each of the multiple layers 62A, 62B is transparent to the wavelength(s) of light used during the photolithographic process.

Figure 6:
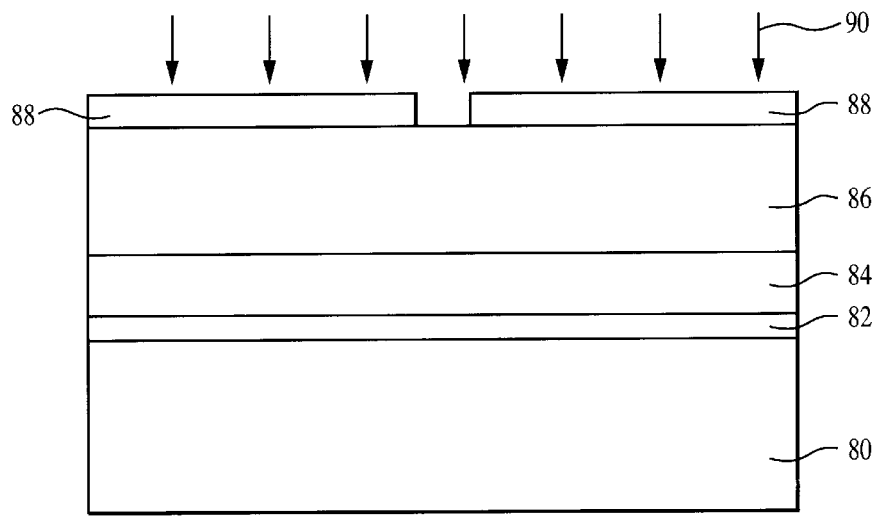
FIG. 6 illustrates a cross-section of a device during performance of a photolithographic process according to another embodiment of the invention.

In situations where the topography of the underlying structures below the first anti-reflective coating is substantially planar, the second anti-reflective coating need not be provided. As shown in FIG. 6, a semiconductor wafer 80, which may include one or more previously-formed layers or regions, has a substantially planar topography. An anti-reflective coating 82 is provided over the wafer 80. The composition of the anti-reflective coating 82 can be similar to those discussed above with respect to the anti-reflective coating 60. In general, as previously discussed, the complex refractive index of the anti-reflective coating 82 should be selected to maximize the absorption at the anti-reflective coating to minimize the amount of transmitted light through the anti-reflective coating back from the underlying structures formed on the wafer 80. A BPSG or other protective layer 84 is provided over the anti-reflective coating 82. A photo-lithographic pattern then is formed by providing a photosensitive film 86, such as photoresist, over the protective layer 84 and exposing the photoresist to an appropriate source of radiation 90 with a mask 88 in place over the photoresist. Although the protective layer 84 is transparent to the radiation 90, any light reflected from the interface of the protective layer and the anti-reflective coating 82 will tend to be reflected substantially uniformly. Therefore, notching of the photoresist pattern 86 can be reduced or eliminated.

Although the foregoing techniques have been described with respect to a protective layer in a specific semiconductor device, an anti-reflective coating can be provided immediately below any layer to which a photolithographic pattern is to be transferred and which is transparent to the wavelength of light used during the photolithographic process.

Other implementations are within the scope of the following claims.

What is claimed is:

1. A method of fabricating a device using a photolithographic process, wherein a wavelength of light is used during the photolithographic process, the method comprising:

providing a silicon oxide layer over a surface of a substrate;

providing a continuous anti-reflective coating of a first thickness over and in contact with the silicon oxide layer, wherein the anti-reflective coating is formed of a material selected from the group consisting of silicon oxides, silicon nitrides and silicon oxy-nitrides;

providing a layer which is transparent to the wavelength of light over the continuous anti-reflective coating and to a second thickness greater than the first thickness and as great as 20,000 Angstroms, wherein the transparent layer includes a material selected from the group consisting of BPSG, PSG and TEOS;

providing a photosensitive material above the layer that is transparent to the wavelength of light; and exposing the photosensitive material to a source of radiation including the wavelength of light.

2. The method of claim 1 wherein the anti-reflective coating extends beneath substantially the entire transparent layer.

3. The method of claim 2 wherein providing an anti-reflective coating includes providing an anti-reflective coating with a complex refractive index which increases absorption of light passing through an interface of the transparent layer and the anti-reflective coating.

4. The method of claim 2 wherein exposing the photosensitive material to a source of radiation includes selectively exposing portions of the photosensitive material to the radiation.

5. The method of claim 4 further including:

developing the photosensitive material after exposure to the source of radiation; and transferring a pattern defined by the remaining photosensitive material to at least one underlying layer.

6. The method of claim 2 wherein exposing the photosensitive material to a source of radiation includes exposing the photosensitive material to radiation having a wavelength of approximately 193 nm.

7. The method of claim 2 wherein exposing the photosensitive material to a source of radiation includes exposing the photosensitive material to radiation having a wavelength of approximately 248 nm.

8. The method of claim 2 wherein exposing the photosensitive material to a source of radiation includes exposing the photosensitive material to radiation having a wavelength of approximately 365 nm.

9. A method of fabricating a device using a photolithographic process, wherein a wavelength of light is used during the photolithographic process, the method comprising:

providing a continuous silicon oxide layer over a surface of a substrate;

forming a first anti-reflective coating over and in contact with the continuous silicon oxide layer, wherein the first anti-reflective coating forms a continuous first anti-reflective coating region, and wherein the first anti-reflective coating is formed of a material selected from the group consisting of silicon oxides, silicon nitrides and silicon oxy-nitrides;

providing a layer which is transparent to the wavelength of light over the first anti-reflective coating, wherein the transparent layer includes a material selected from the group consisting of BPSG, PSG and TEOS;

forming a second anti-reflective coating over the layer which is transparent to the wavelength of light, wherein the second anti-reflective coating forms a continuous second anti-reflective coating region, and wherein the second anti-reflective coating formed of a material selected from the group consisting of silicon oxides, silicon nitrides and silicon oxy-nitrides;

providing a photosensitive material over the second anti-reflective coating; and selectively exposing the photosensitive material located over the continuous first anti-reflective coating region and the continuous second anti-reflective coating region to a source of radiation including the wavelength of light;

developing the photosensitive material after exposure to the source of radiation; and transferring a pattern defined by the remaining photosensitive material to at least one underlying layer.

10. The method of claim 9 wherein providing a first anti-reflective coating includes providing an anti-reflective layer with a complex refractive index which increases absorption of light passing through an interface of the transparent layer and the first anti-reflective coating.

11. The method of claim 10 wherein providing a second anti-reflective coating includes providing an anti-reflective layer with a complex refractive index which reduces reflectivity of light at an interface between the photosensitive material and the second anti-reflective coating.

12. The method of claim 9 wherein the first anti-reflective coating includes a material comprising silicon and nitrogen.

13. The method of claim 9 wherein the first anti-reflective coating includes a material comprising silicon and oxygen.

14. The method of claim 9 wherein the second anti-reflective coating includes a material comprising silicon and nitrogen.

15. The method of claim 9 wherein the second anti-reflective coating includes a material comprising silicon and oxygen.

* * * * *